United States Patent [19]

Reznikov

[11] Patent Number: 5,223,674
[45] Date of Patent: Jun. 29, 1993

[54] LOCKING STANDOFF FOR CIRCUIT BOARDS

[75] Inventor: Naum Reznikov, Fremont, Calif.

[73] Assignee: Sun Microsystems, Inc., Mountain View, Calif.

[21] Appl. No.: 768,833

[22] Filed: Sep. 30, 1991

[51] Int. Cl.⁵ .................. H01B 17/24; H05K 7/12
[52] U.S. Cl. ..................... 174/138 D; 174/138 G; 174/166 S; 361/412
[58] Field of Search .......... 174/138 D, 138 G, 138 R, 174/156, 157, 158 R, 166 R, 166 S; 211/41; 361/412, 413; 411/15, 508; 248/27.3, 73, 239

[56] References Cited

U.S. PATENT DOCUMENTS

| | | | |
|---|---|---|---|
| 4,007,516 | 2/1977 | Coules | 174/138 D X |
| 4,100,368 | 7/1978 | Thomsen | 174/138 D |
| 4,502,193 | 3/1985 | Harmon et al. | 174/138 D X |
| 4,970,761 | 11/1990 | Nakamura | 174/138 D X |

OTHER PUBLICATIONS

U.S. Publication "Engineered Plastic Fasteners" Pub. by Phillips Plastics Corp Jan. 1990.
U.S. Publication "ITW Fastex Where The world is Turning for Fastening Solutions." Pub. by Illinois Tool Works, Inc., Copyright 1991.

Primary Examiner—Leo P. Picard
Assistant Examiner—Hyung S. Sough
Attorney, Agent, or Firm—Blakely Sokoloff Taylor & Zafman

[57] ABSTRACT

The present invention pertains to standoff devices used to hold a circuit board a fixed distance from a mounting surface such as another circuit board. The present invention divides the standoff into two interacting members. The first member has a base and two arms disposed to define a receiving slot between the two arms. The second member is comprised of a head portion, a tapered portion, and a tongue portion. The second member is slidably disposed within the receiving slot of the first member, and is capable of being locked into place in two distinct locking positions within this receiving slot. By sliding the second member from the first locking position to the second locking position, the standoff is locked into place between the circuit board and the mounting surface. The present invention discloses a secure locking system utilizing locking projections and cooperating depressions to accomplish this locking function. The present invention further pertains to improved methods of installing standoffs resulting from such a locking standoff.

3 Claims, 5 Drawing Sheets

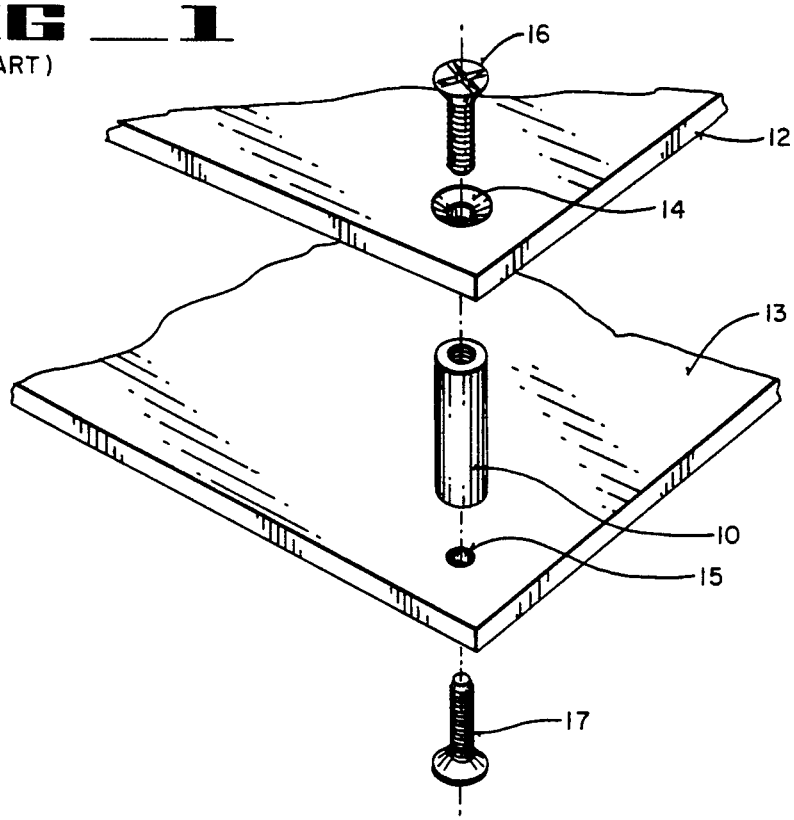
FIG_1 (PRIOR ART)
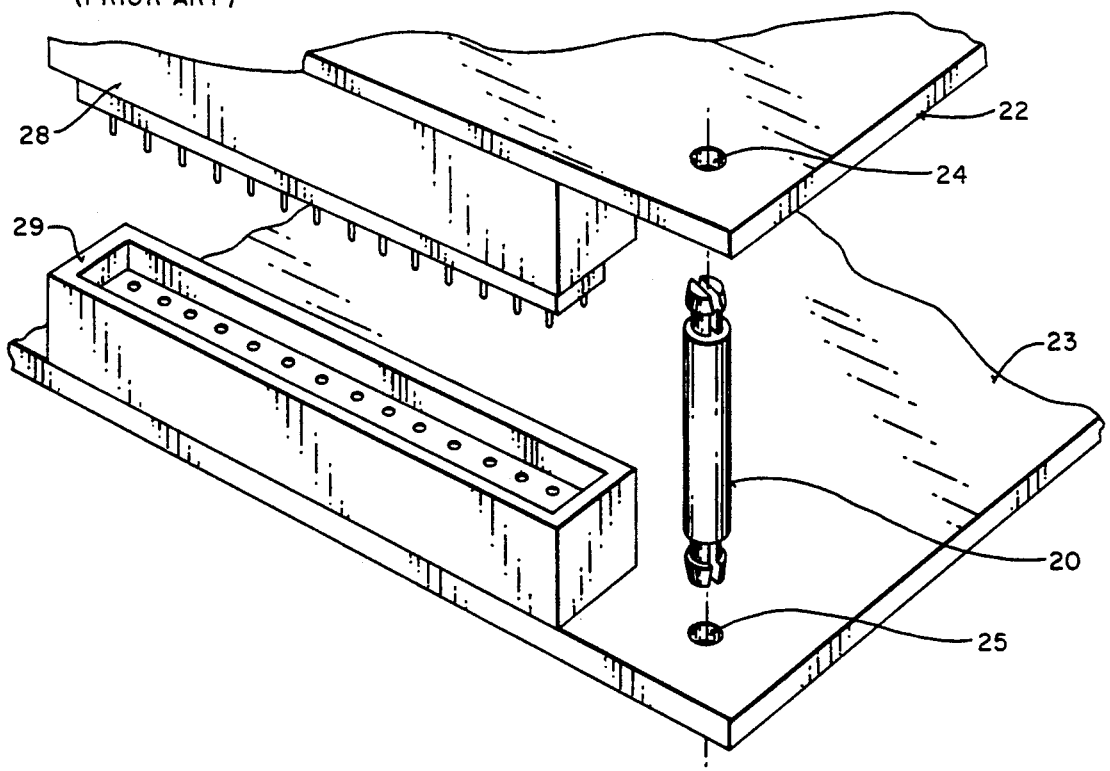
FIG_2 (PRIOR ART)

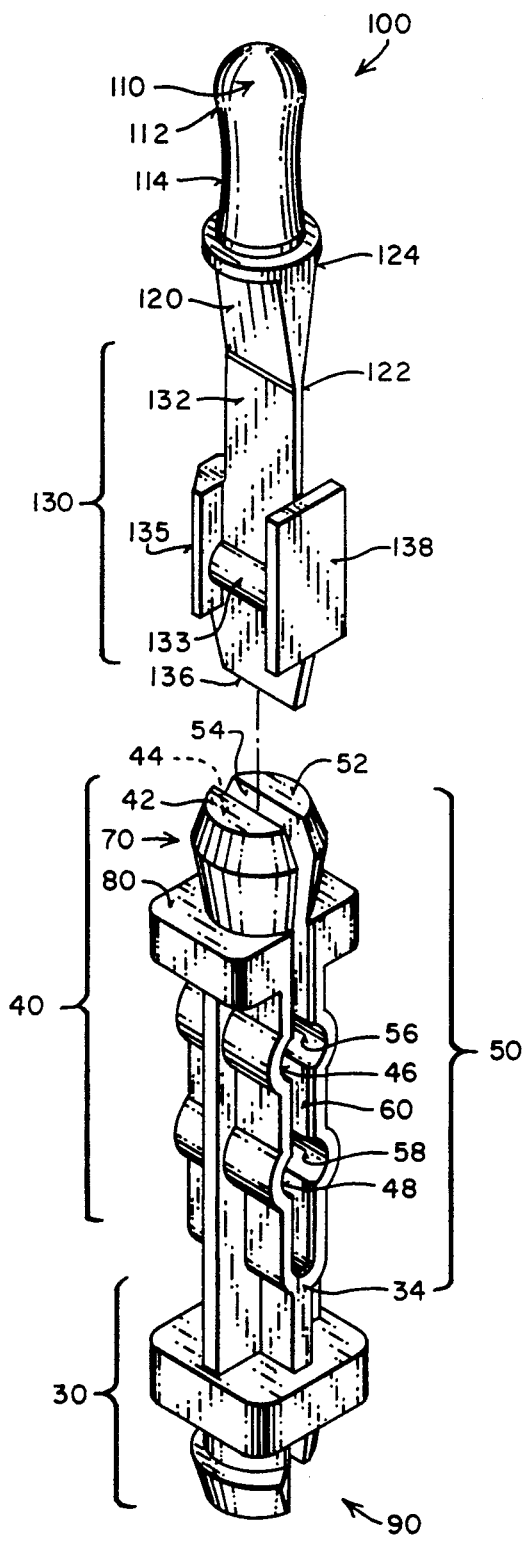
FIG_3A
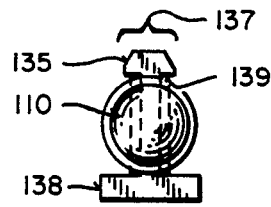
FIG_3B
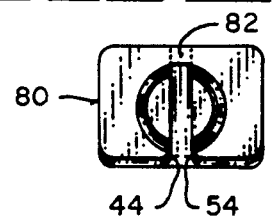
FIG_3C
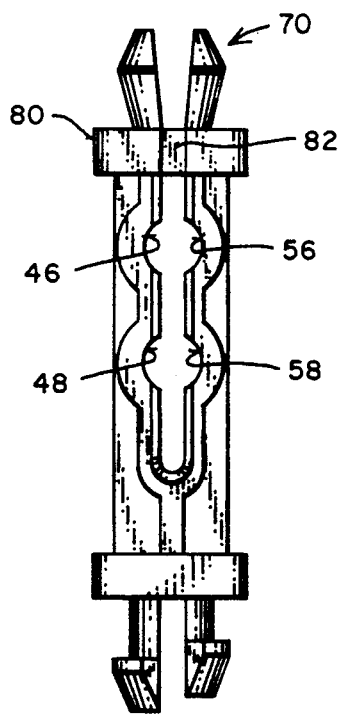
FIG_3D

FIG_4A
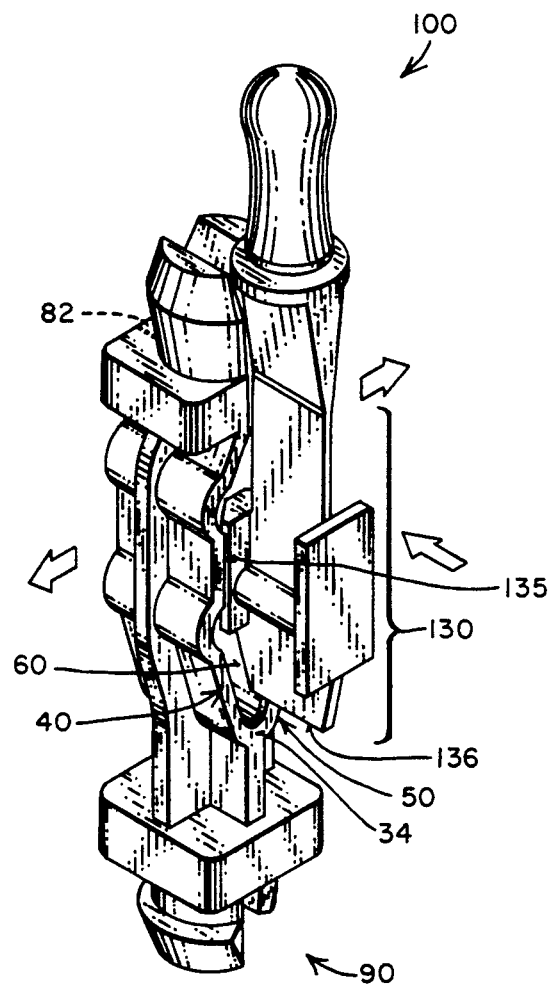
FIG_4B
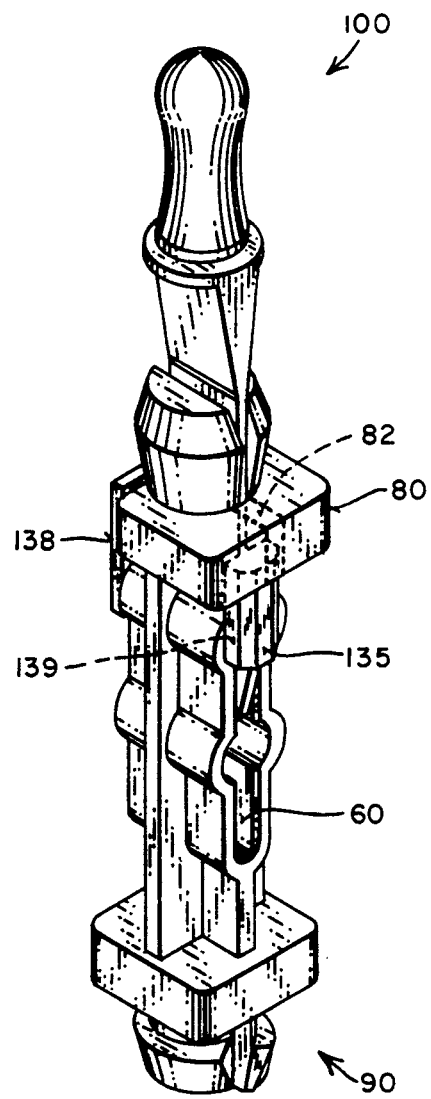

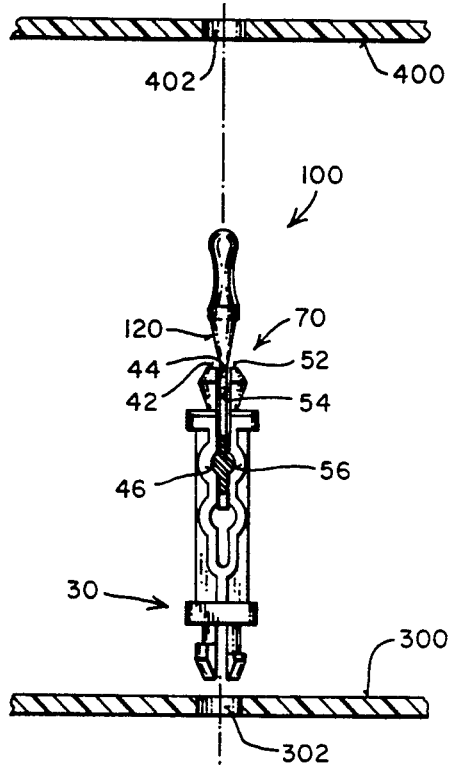
FIG_5A
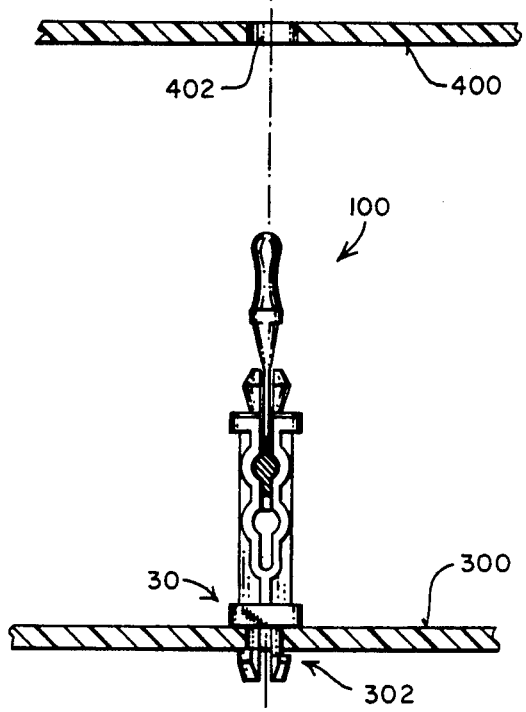
FIG_5B
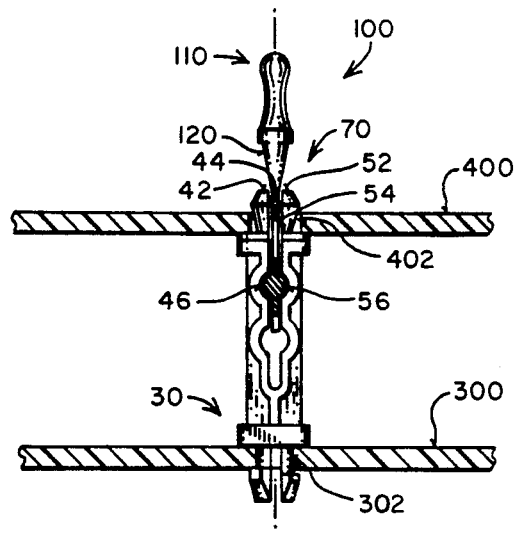
FIG_5C
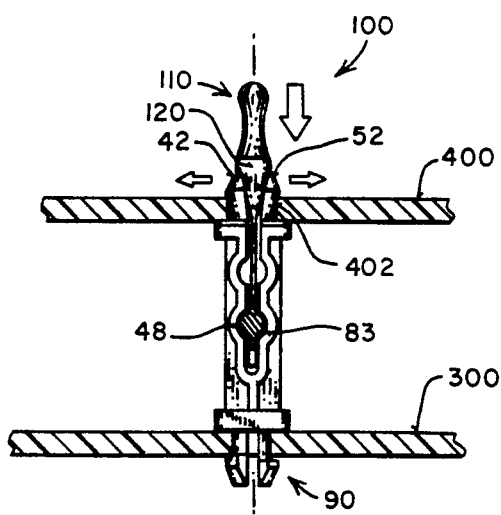
FIG_5D

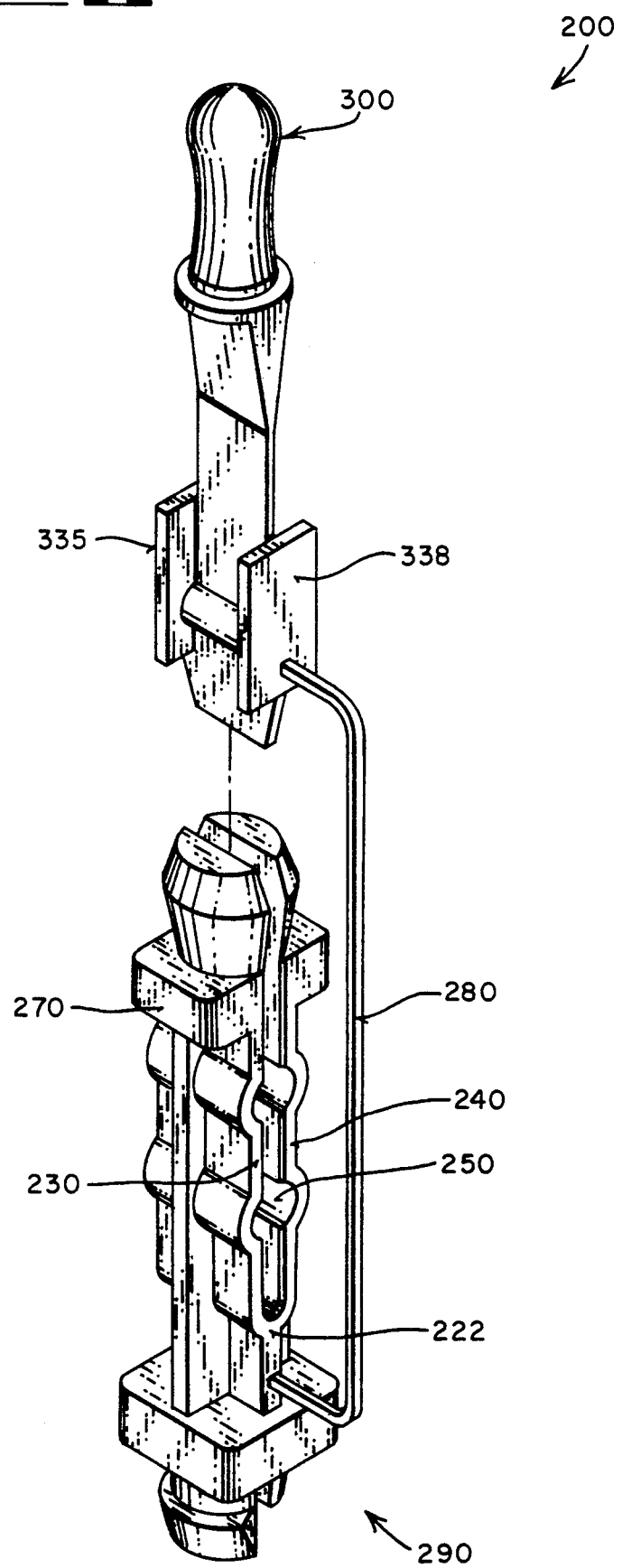

LOCKING STANDOFF FOR CIRCUIT BOARDS

BACKGROUND OF THE INVENTION

1. Field of the Invention:

The present invention relates to the field of circuit board mounting devices, and more particularly, to standoff devices used to hold a circuit board a fixed distance from a mounting surface such as another circuit board.

2. Art Background:

Standoffs are commonly used in the electronics industry to securely hold a first circuit board a fixed distance apart from a second circuit board. Standoffs hold these circuit boards a fixed distance apart in order to insure that a certain free space between the boards is retained and to prevent the components and exposed connections from electrically coupling through physical contact. For efficiency in assembly, the installation of such standoffs should be both quick and easy.

Prior art standoffs have traditionally been characterized by simple form and function. Many prior art standoffs utilize screws to secure the standoff between the two circuit boards. Such standoffs suffer from several disadvantages, principal among these is the difficult and time consuming nature of installation. The use of screws necessitates access to the bottom of the circuit board, access which is very inconvenient in the production environment. Additionally, the required screws, as separate pieces, are subject to being lost or misplaced. Other prior art standoffs comprised of a single piece without screws, overcome some of these disadvantages. However, such standoffs suffer from installation alignment problems and relatively difficult removal.

As will be described, the present invention provides a standoff for securely and efficiently holding a first circuit board a fixed distance from a second circuit board which does not suffer from the disadvantages found in the prior art. The present invention provides a standoff which is easy to install, without the need for separate pieces. Once in place between the circuit boards, the present invention allows manipulation of the circuit boards, and further provides a locking mechanism for securely locking the standoff into place between the circuit boards.

SUMMARY OF THE INVENTION

The present invention provides a standoff which can be advantageously locked into place between a circuit board and a mounting surface such as another circuit board. The standoff consists of two interacting members, slidably disposed with respect to one another. In the preferred embodiment, the first member comprises a base and two arms extending from this base. The base is designed to allow attachment to a mounting surface. Each of the arms extending from the base has a free end and an inner surface. The two arms are disposed such that their inner surfaces are substantially parallel to one another, thereby forming a receiving slot between the two arms.

The second member comprises a head, a tapered portion, and a tongue. The tapered portion is tapered from a larger first end to a smaller second end. The head is attached to the larger first end, and the tongue extends out from the smaller second end. The second member is slidably disposed within the receiving slot of the first member such that it can be slidably moved with respect to the first member. Through this sliding movement, the tapered portion of the second member is permitted to slidably contact the inner surfaces of the arms of the first member, such that through such slidable contact, the free ends of the arms are displaced outwardly with respect to one another.

The locking mechanism is comprised of locking projections and cooperating depressions. The locking projections are disposed upon the tongue of the second member. The cooperating depressions are embedded in the inner surfaces of the arms of the first member. When the locking projections engage these cooperating depressions, the second member locks into place with respect to the first member.

The preferred embodiment contemplates two distinct locking positions. With the standoff in the first locking position, the locking projections are engaged within a first set of cooperating depressions. With the standoff in the second locking position, the locking projections are engaged within a second set of cooperating depressions. By sliding the standoff from the first locking position to the second locking position, the free ends of the arms are displaced outwardly with respect to one another and the standoff is thereby locked into place.

BRIEF DESCRIPTION OF THE DRAWINGS

Further details are explained below with the help of the examples illustrated in the attached drawings in which:

FIG. 1 is an illustration of a prior art standoff requiring screws for installation.

FIG. 2 is an illustration of a second prior art standoff.

FIG. 3A is an exploded view of the preferred embodiment of the present invention separating, for the benefit of illustration, the two members of the standoff.

FIG. 3B is a top view of the second member showing the difference in dimensions of the sidewalls of this member.

FIG. 3C is a top view of the first member illustrating the inner surfaces forming a slot, and the bracing of the arms.

FIG. 3D is a frontal view of the first member alone.

FIG. 4A illustrates the assembly of the preferred embodiment through the forceful insertion of the second member into the receiving area of the first member.

FIG. 4B illustrates the preferred embodiment fully assembled and ready to use as a single piece.

FIGS. 5A, 5B, 5C, and 5D illustrate the functioning and method of installation of the present invention.

FIG. 6 illustrates an alternative embodiment using a leash between the first member and the second member.

DETAILED DESCRIPTION OF THE INVENTION

An improved standoff device is disclosed having particular application for use in mounting a circuit board a fixed distance from a mounting surface such as another circuit board. In the following description, for purposes of explanation, numerous details are set forth such as specific materials and angles of orientation in order to provide a further understanding of the present invention. However, it will be apparent to one skilled in the art that these specific details are not required in order to practice the present invention. It will be particularly noted that the present invention is described as functioning within the environment of affixing two circuit boards a fixed distance apart. It will be appreciated that this environment has been chosen for illustrative purposes, and that the present invention finds application, more generally, to mounting a board a fixed distance from a mounting surface.

FIG. 1 illustrates a standoff found in the prior art. Standoff 10 is essentially a hollow cylinder, threaded internally, and having a prescribed length. Typically, a number of such standoffs are used between two circuit boards to adequately secure the boards a fixed distance apart. Standoff 10 can be installed by first inserting standoff 10 between circuit boards 12 and 13, flush with acceptance holes 14 and 15. Screws 16 and 17 are then used to tighten the standoff in place. When screws 16 and 17 are fully tightened, standoff 10 serves to rigidly hold circuit boards 12 and 13 a fixed distance apart. Standoff 10 can be removed by unscrewing screws 16 and 17.

The standoff shown in FIG. 1 suffers from several disadvantages, principal among these is the difficult and time consuming nature of its installation. Installing this standoff requires screws which must be reached and tightened using a screw driver or the like. Frequently, within the production context, at least one end of a standoff, such as standoff 10, is flush with an acceptance hole that is not in an accessible position. In particular, standoff 10 requires access to the bottom of circuit board 13 in order to install screw 17, access which can be very inconvenient in the production environment. Additionally, the required screws, as separate pieces, are subject to being lost prior to installation, or disadvantageously dropped following an unsuccessful installation. Such setbacks can consume both time and money in the production environment.

A second prior art standoff can be seen in FIG. 2. Standoff 20 does not suffer from many of the disadvantages inherent in standoff 10. Standoff 20 comprises a single piece which does not require screws for installation. To install standoff 20, the bottom end of standoff 20 is initially pushed into the acceptance hole 25, thereby affixing the standoff to circuit board 23. Then, the top end of standoff 20 is lined up with acceptance hole 24, and circuit board 22 is pushed downwardly, thereby affixing the standoff to circuit board 22 as well.

Standoff 20, however, suffers from certain disadvantages. In the context of rigidly holding circuit boards a fixed distance apart, frequently such boards have a desired point of electrical connection between them. Typically, this point of connection takes the form of a male connector on one board and a female connector on another board. Such a connector arrangement is shown in FIG. 2 with male connector 28 on board 22 and female connector 29 on board 23. Frequently, in order to securely and dependably connect such connectors together, one must initially align the male connector and the female connector, then move and manipulate the connectors with respect to one another until a firm and fixed connection is established. In practice, particularly with male and female connectors involving an array of connections, a male connector can rarely be securely and adequately joined to a female connector by simply pushing the two together in a straight and deliberate fashion.

This straight and deliberate motion, however, is precisely what is needed to install standoff 20 between the two circuit boards. Thus, standoff 20 is inadequate when the two circuit boards have a point of electrical connection between them which must be first aligned, moved, and manipulated. In addition, standoff 20 suffers from the fact that once the circuit boards are connected together with this standoff, the boards cannot be easily disengaged. Frequently, circuit boards need to be disengaged for testing, service, or replacement.

FIG. 3A illustrates an exploded view of the preferred embodiment of the present invention separating out, for the benefit of illustration, the two members 90 and 100 of the standoff. Referring to FIG. 3A, the first member 90 has a base 30, having a base junction 34. Extending from the base junction 34 is arm 40 which terminates in free end 42. Also extending from base junction 34 is arm 50 which terminates in free end 52. Arm 40 has an inner surface 44 extending the length of the arm, and similarly, arm 50 has an inner surface 54 extending the length of the arm. These arms are preferably made of a resilient or stretchable material. In the preferred embodiment, these arms are made of a nylon or plastic material. The arms are situated such that their inner surfaces 44 and 54 are facing inward, towards each other, thereby forming a slot 60 between arms 40 and 50. This slot 60 will serve as a receiving area for the second member 100. The free ends 42 and 52, together, define the larger, bulbous receiving head 70.

In the preferred embodiment, the arms 40 and 50 are connected to each other by collar 80 situated just below the receiving head 70. Greater detail of this feature can be seen in FIG. 3C illustrating a top view of first member 90. FIG. 3C illustrates the connective role of collar 80. In particular, it can be seen that the brace portion 82 of collar 80 effectively bridges the distance between inner surface 44 and 54. It can further be noted from both FIG. 3A and FIG. 3C that collar 80 does not connect arms 40 and 50 on both sides of slot 60. Instead, it has a single brace portion 82 connecting arms 40 and 50 on a single side of slot 60.

Referring again to FIG. 3A, the second member 100 comprises a head portion 110, a tapered portion 120, and a tongue portion 130. The tapered portion 120 can perhaps best be understood by referring to its top end 124 and its bottom end 122. The cross-sectional area of the top end 124 is greater than the cross-sectional area of the bottom end 122 such that the tapered portion 120 is tapered from top end 124 to bottom end 122. The tapered portion illustrated in this figure is shown as taking the form of a wedge, however, other tapered portion shapes, including cones tapered from base to tip can be used. Other tapered shapes would require minor changes to the receiving head 70, adapting the inner walls of the receiving head to accept the alternative shape.

Extending out from the bottom end of tapered portion 120 is the tongue portion 130. The tongue 130 has a top surface 132, a bottom surface opposite this top surface (not shown in FIG. 3A), and a tip 136. On one side of the tongue 130, there is smaller sidewall 135, and on the opposite side is larger sidewall 138. FIG. 3B, a top view of second member 100, shows the differences in shape and size between the smaller sidewall 135 and larger sidewall 138.

The head portion 110 is connected to the tapered portion 120 at its top end 124. Head portion 110 can take any of several shapes. Head 110 can be advantageously shaped to permit an individual to firmly grasp the head, for example between two fingers. Alternatively, the head 110 can be designed and shaped to accommodate a certain grasping tool or device. As shown in the preferred embodiment, the head has a bulbous top 112 and a more slender body 114, permitting an individual to firmly grasp the head between two fingers.

The assembly of the standoff of the present invention is illustrated in FIG. 4A. In general, the standoff is assembled by first aligning second member 100 with respect to the slot 60 in first member 90, then applying pressure to second member 100, thereby forcing the second member 100 into slot 60.

More particularly, the second member 100 is initially aligned longitudinally with respect to the longitudinal direction of slot 60. Tip 136 of tongue 130 should not extend below the base junction 34. In addition, the second member is also aligned as shown in FIG. 4A such that its smaller sidewall 135 is facing in towards the side of slot 60 that does not have brace portion 82 on it. Referring to FIG. 3B it can be seen that the smaller sidewall 135 is specially shaped, having an outer surface 137 of a width smaller width than the width of inner surface 139. The width of outer surface 137 should be smaller than the width of slot 60, while the width of the inner surface 139 should be greater than the width of slot 60.

It can be appreciated that the special shape of sidewall 135 allows this sidewall, when placed atop slot 60, to initially enter and only partially penetrate slot 60. From this position of partial penetration, further force must be applied, pushing first member 90 and second member 100 together, thereby pushing sidewall 135 further into slot 60. Necessarily, in order for slot 60 to accommodate this action, arms 40 and 50 must resiliently allow slot 60 to open slightly wider. This accommodation is readily obtained when arms 40 and 50 are made of a resilient nylon or plastic material. Alternatively, arms 40 and 50 can be made of a more rigid material and brace portion 82 can be made of a resilient material, thereby allowing the arms 40 and 50 to spread slightly.

As smaller sidewall 135 is pushed into slot 60, the tongue portion 130 as a whole is pushed into slot 60 behind it. Eventually, the smaller sidewall reaches the other side of slot 60 and the tongue portion 130 is snapped into place within slot 60, with arms 40 and 50 closing back together. Once the second member is snapped into place, the standoff is assembled and ready for use. The tongue portion 120 of second member 100 is slidably disposed within the slot 60 such that the second member can be slidably moved up and down with respect to the first member 90.

The fully assembled preferred embodiment is shown in FIG. 4B. FIG. 4B, it should be noted, illustrates the fully assembled standoff of FIG. 4A turned 180 degrees to show the interaction of the smaller sidewall 135 with the collar 80. As can be seen in FIG. 4B, the wider inner surface 139 of smaller sidewall 135 and the larger sidewall 138 serve to keep the tongue 130 disposed within the slot 60. In particular, these two sidewalls prevent the second member from slipping laterally out of the slot. It can also be seen that when the second member is pulled upward, the smaller sidewall 135 abuts up against collar 80, preventing the second member from being pulled out of slot 60. Thus, in the preferred embodiment, the second member is slidably movable within the first member, but it is a captive of the first member. Namely, in the preferred embodiment, the second member 100 is not allowed to fully leave the first member 90.

While these sidewalls 135 and 138 are found in the preferred embodiment, and serve to captivate the second member 100 within the first member 90, they are not necessarily essential in every embodiment of the invention. For example, second member 100 can be constructed without any sidewalls, allowing for easier insertion into slot 60, while providing less predictable slidable movement, and no captivity. Or, in the alternative, the second member 100 can be constructed with a single sidewall providing some predictability in slidable movement, and some captivity.

The locking feature of the present invention will now be described. With second member 100 placed within first member 90 such that it can be slidably moved within slot 60, the present invention provides means for locking the second member 100 into a particular fixed position with respect to first member 90. This lockability is ultimately critical to insure that the standoff functions properly when placed between a board and a mounting surface. The present invention contemplates numerous means for performing this locking function including: latching the second member 100 against the first member 90, having one or more projections upon tongue 130 cooperating with one or more depressions on the inner surfaces of arms 40 and 50, or having one or more depressions upon tongue 130 cooperating with at least one or more projections on the inner surfaces of arms 40 and 50.

Referring again to FIG. 3A, the locking mechanism of the preferred embodiment is illustrated. First member 90 has a first depressions 46, a second depression 48, a third depression 56, and a fourth depression 58. In particular, depressions 46 and 48 are embedded in the inner surface 44 of arm 40, and depressions 56 and 58 are embedded in the inner surface 54 of arm 50. These depressions are embedded within inner walls 44 and 54 in a symmetrical and cooperative fashion as illustrated in both FIG. 3A and FIG. 3D. As can be seen, these depressions run perpendicular to the direction of extension of each arm.

The second member 100 has locking projections upon it which serve to engage these cooperating depressions. In particular, tongue 130 has upon its top surface 132, locking projection 133. A similarly situated and shaped projection (not shown in FIG. 3A) is found on the bottom surface opposite this top surface. These locking projections are shaped advantageously to correspond to the shape of the depressions embedded in the inner surfaces. For example, locking projection 133 is shaped like a half cylinder, thereby corresponding in shape to the depressions embedded in inner wall 44.

The preferred embodiment has two distinct, predetermined locked positions. These two locked positions can be seen in FIGS. 5C and 5D. It should be noted that in these figures, the sidewalls 135 and 138 have been omitted to more clearly show the locking positions and operation. In the actual practice of the preferred embodiment, these sidewalls would be in place as earlier described. FIG. 5C illustrates the first locked position corresponding to when the locking projections engage depressions 46 and 56. FIG. 5D illustrates the second locked position corresponding to when the locking projections, instead, engage depressions 48 and 58.

By constructing the arms of a resilient material, the preferred embodiment permits the projections to slidably enter the depressions or slidably depart the depressions with the application of force to second member 100. In particular, the head 110 can be grasped between the fingers to apply this force manually. For example, assuming the second member 100 is presently in the first locked position shown in FIG. 5C, with the application of a downward force on the head, the second member is slidably moved into the second locked position seen in FIG. 5D. From this position, the head can be grasped and pulled, causing the second member to be slidably pulled back into the first locked position shown in FIG. 5C.

The functioning and method of installation of the preferred embodiment will now be described. Referring to FIG. 5A, the standoff is in what has been referred to as the first locked position; namely, the second member 100 has engaged locking depressions 46 and 56. In the preferred embodiment of the present invention, when the standoff is in the first locked position, the tapered portion 120 is entirely clear of receiving head 70, and in particular, free ends 42 and 52. Instead, the receiving head 70 has between it a thin piece of the tongue extending out from the tapered portion 130. As can be seen in FIG. 5A, this piece of tongue is thin enough such that any contact with the portions of inner surfaces 44 and 54, within receiving head 70, is marginal.

In FIG. 5B, the standoff remains in this first locked position. Base 30, however, is inserted through acceptance hole 302 of board 300, thereby affixing this end of the standoff to board 300.

In action taking place between FIGS. 5B and 5C, the head 110, the tapered portion 120, and the receiving head 70 are inserted into, and through acceptance hole 402 of board 400. As can be appreciated, the dimensions of these elements must be such that they can be inserted through the desired acceptance hole, here acceptance hole 402, of the board.

With the standoff in place between boards 300 and 400, as shown in FIG. 5C, the boards are aligned but not secured. Receiving head 70 is disposed within acceptance hole 402, but it is not affixed because the diameter of acceptance hole 402 is greater than the present diameter of receiving head 70. There is only a loose fit. Thus, with the standoff in this position, an individual is able to move and manipulate board 400 with respect to board 300. As discussed earlier, this ability to move and manipulate two boards with respect to one another immediately prior to securing a standoff between them is particularly important when there is a male and female connector arrangement between the two boards.

Following any desired movement or manipulation of the boards, the standoff is ready to be affixed and locked into place. FIG. 5D illustrates the standoff 200 when it is affixed and locked into place. In order to accomplish this change from FIG. 5C to FIG. 5D, the head 110 is pushed in a downward motion towards the receiving head 70. The tapered portion 120 first enters the receiving head 70, and begins to slidably contact the portion of the inner walls 44 and 54 within receiving head 70. As the tapered portion is driven further and further into the receiving head 70, this sliding contact with the inner walls 44 and 54 begins to cause the receiving head 70 to expand. In particular, this sliding motion causes the free ends 42 and 52 to be displaced outward with respect to one another. At a certain point, the rapidly expanding receiving head expands to the point where it is flush and snug with the acceptance hole 402. At this point, or a point or slightly thereafter, the standoff is designed to lock into the second locked position.

The depressions 48 and 58, therefore, have been placed in positions such that at the point where a snug fit is experienced, the locking projections engage depressions 48 and 58. Thus, the standoff simultaneously locks itself to board 400, and locks the second member 100 into a secure position with respect to the first member 90. This resulting desirable locked condition is shown in FIG. 5D.

The desirable locked condition that is shown in FIG. 5D, it should be noted, is not permanent. Should an individual wish to disconnect the standoff from board 400, the aforementioned process is simply reversed. In brief, starting from FIG. 5D, the head 110 is grasped and pulled up, away from receiving head 70. The locking projections then disengage from depressions 48 and 58, and the tapered portion 120 begins to leave the receiving head 70. As the tapered portion 120 is slidably moved out of the receiving head, the receiving head begins to contract. Eventually, the first locked position is reached, and the standoff 200 is now in the condition shown in FIG. 5C. In this locked position, the receiving head 70 is once again loose within acceptance hole 402, and the board 400 can be removed.

As can be appreciated from the foregoing description, the present invention provides a standoff which is easy to install, allowing for manipulation of the boards following initial placement, and capable of being securely locked into place between the boards. This process of installation is both quick and easy.

The present invention encompasses additional alternative processes of installation. As an alternative, instead of initially affixing the base as shown in FIG. 5B, the sliding second member can be utilized to initially lock the standoff into place in a first board, then the base can be affixed to a second board. of two boards, and the base can be affixed to the first board at substantially the same time as the second member is used to lock the standoff to a second board.

While much of the description has focussed on the preferred embodiment, the present invention encompasses numerous alternative embodiments. One such alternative embodiment of the present invention is shown in FIG. 6. In this embodiment, a leash 280 is used to connect a first member 290 and a second member 300 of standoff 200. Unlike the preferred embodiment, this embodiment does not have a brace portion on its collar 270. Instead, the arms 230 and 240 are connected only at base junction 222. As such, this embodiment of the invention allows for easy assembly. The second member 300 is simply lowered into the slot 250 between arms 230 and 240, and the standoff is ready to function.

In this alternative embodiment, the sidewalls 335 and 338 of the second member 300 can both be large. There need not be a smaller sidewall to facilitate the assembly of the standoff. In most other respects, as can be seen from FIG. 6, standoff 200 resembles the preferred embodiment in its design. It functions in substantially the same way as was shown in FIGS. 5A-5D.

As can additionally be appreciated, numerous changes to the preferred embodiment are possible without disrupting the essential functioning of the standoff shown in FIG. 3A. For example, the tapered portion 120 can take any number of tapered shapes; the inner surfaces 44 and 54 within the receiving head would be modified to accommodate any selected different shape. The shape of the head 110 can be changed, as well as the shapes of the sidewalls 135 and 138. With respect to the first member 90, the base can be shaped differently.

The present invention can, in particular, be modified such that, in the place of the base 30 shown in FIG. 3A, a mirror image of the assembly shown above base junction 34 can be incorporated below base junction 34. In effect, a third member, similar to second member 100 could be similarly, slidably disposed between two new additional arms extending down below the base junction 34. Thus, in such a standoff, there would be four arms and two slidable members, these members slidable within two slots disposed within the first member 90. Such a standoff would have two slidable and lockable members, one for each end of the standoff.

While the present invention has been described in great detail in terms of the presently preferred embodiment, those skilled in the art will recognize that the invention is not limited to the embodiment described. The method and apparatus of the present invention can be practiced with modification and alteration within the scope of the appended claims. The description is thus to be regarded as illustrative instead of limiting on the present invention.

I claim:

1. A locking standoff comprising:
   a first member including a base and first and second arms extending from said base, said first arm having an inner surface and a free end, said second arm having an inner surface and a free end, said first and second arms disposed such that said inner surface of said first arm faces said inner surface of said second arm defining a slot between said arms;
   a second member including a tapered portion and a tongue portion, said tapered portion comprising a first end and a second end, said first end having a cross-sectional area greater than the cross-sectional area of the said second end such that said tapered portion is tapered from said first end to said second end, said tongue portion coupled to said second end of said tapered portion, extending therefrom;
   said second member slidably disposed within said slot permitting said tapered portion to slidably contact said inner surface of said first arm and said inner surface of said second arm such that through such slidable contact said free ends of said arms are displaced with respect to one another;
   means for locking said second member slidably disposed within said slot into a predetermined position with respect to said first member;
   wherein said first member further includes a collar, said collar disposed about said arms near said free ends, said collar having a brace portion which couples said first and second arms together;
   wherein said tongue portion has disposed about it a first and second sidewall, and wherein said second member while slidably disposed within said slot, is secured against removal from said slot by said first sidewall, said second sidewall, and said brace portion of said collar.

2. A method of assembling a two member standoff comprising a first member including a base and first and second arms extending from said base, a brace portion which couples said first and second arms together, said first arm having a first free end and a first inner surface, said second arm having a second free end and a second inner surface, said first arm and said second arm disposed such that said first inner surface faces said second inner surface thereby defining a slot between said first arm and said second arm, said slot having a first length in a longitudinal direction and a first width in a lateral direction, wherein said first length is greater than said first width; and a second member including a tongue portion having a second length in a longitudinal direction and a second width in a lateral direction, wherein said second length is greater than said second width, and means for securing said second member against removal from said slot coupled to said tongue portion, said method comprising the steps of:
   aligning said tongue portion of said second member longitudinally with respect to the longitudinal direction of said slot;
   applying force such that said second member and said first member abut against one another and said tongue portion is forcibly inserted longitudinally into said slot until said means for securing said second member against removal engages against said slot, thereby securing said second member against removal from said slot.

3. The method for assembling a two member standoff as recited in claim 2, wherein said means for securing comprises a first sidewall disposed upon a first side of said tongue portion and a second sidewall disposed upon a second side of said tongue portion, and said step of applying force comprises the following steps:
   applying force to said second member such that said first sidewall initially enters said slot causing said first arm and said second arm to be displaced with respect to one another;
   applying further force to said second member such that said tongue portion is inserted longitudinally into said slot, said first sidewall exits said slot, and said second sidewall comes into contact with said slot, thereby securing said second member against removal from said slot.

* * * * *